(12) United States Patent
Kim et al.

(10) Patent No.: US 8,953,393 B2
(45) Date of Patent: Feb. 10, 2015

(54) SEMICONDUCTOR DEVICE AND OPERATING METHOD THEREOF

(71) Applicant: SK Hynix Inc., Icheon-si Gyeonggi-do (KR)

(72) Inventors: Hong-Sik Kim, Seongnam-si (KR); Hyung-Dong Lee, Gyeonggi-Do (KR); Hyung-Gyun Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/012,008

(22) Filed: Aug. 28, 2013

(65) Prior Publication Data

US 2014/0092693 A1    Apr. 3, 2014

(30) Foreign Application Priority Data

Sep. 28, 2012  (KR) .................. 10-2012-0108909

(51) Int. Cl.
| | | |
|---|---|---|
| G11C 7/00 | (2006.01) | |
| G11C 29/00 | (2006.01) | |
| G11C 29/40 | (2006.01) | |
| G11C 29/04 | (2006.01) | |

(52) U.S. Cl.
CPC ............ *G11C 29/00* (2013.01); *G11C 29/40* (2013.01); *G11C 2029/0409* (2013.01)
USPC ................. 365/189.07; 365/230.06

(58) Field of Classification Search
CPC ................................. G11C 5/147; G11C 8/08
USPC ........................................ 365/189.07, 239.06
See application file for complete search history.

(56) References Cited

U.S. PATENT DOCUMENTS

| | | | | |
|---|---|---|---|---|
| 4,369,511 | A * | 1/1983 | Kimura et al. | 714/719 |
| 4,835,774 | A * | 5/1989 | Ooshima et al. | 714/719 |
| 4,888,772 | A * | 12/1989 | Tanigawa | 714/719 |
| 5,400,342 | A * | 3/1995 | Matsumura et al. | 714/719 |
| 5,959,929 | A * | 9/1999 | Cowles et al. | 365/230.03 |
| 6,011,992 | A * | 1/2000 | Hubbard et al. | 600/547 |
| 6,456,560 | B2 * | 9/2002 | Arimoto et al. | 365/233.14 |
| 7,249,301 | B2 * | 7/2007 | Perner | 714/733 |
| 7,313,741 | B2 * | 12/2007 | Vollrath et al. | 714/718 |
| 7,587,645 | B2 * | 9/2009 | Chang et al. | 714/738 |
| 7,684,257 | B1 * | 3/2010 | Lee et al. | 365/189.011 |
| 7,869,271 | B2 * | 1/2011 | Lee et al. | 365/163 |
| 8,437,209 | B2 * | 5/2013 | Song | 365/201 |
| 8,570,822 | B2 * | 10/2013 | Hama | 365/201 |
| 8,625,363 | B2 * | 1/2014 | Ku et al. | 365/189.05 |
| 8,699,279 | B2 * | 4/2014 | Kang | 365/189.05 |
| 2009/0055698 | A1 | 2/2009 | Resnick | |

* cited by examiner

*Primary Examiner* — Michael Tran
(74) *Attorney, Agent, or Firm* — William Park & Associates Patent Ltd.

(57) ABSTRACT

A semiconductor device may test a semiconductor memory device by storing a data sample that is sampled from among data requested to be written into a semiconductor memory device and by comparing the data sample with data read from the semiconductor memory device which corresponds to the data sample.

20 Claims, 3 Drawing Sheets

SEMICONDUCTOR DEVICE AND OPERATING METHOD THEREOF

CROSS-REFERENCE TO RELATED APPLICATIONS

The present application claims priority to Korean Patent Application No. 10-2012-0108909, filed on Sep. 28, 2012, which is incorporated herein by reference in its entirety.

BACKGROUND

1. Technical Field

Embodiments of the present invention generally relate to a semiconductor device and an operating method thereof, and more particularly to a semiconductor device capable of testing a semiconductor memory device while the semiconductor memory device is in operation and an operating method thereof.

2. Related Art

Normal Built-In Self-Test (BIST) operations are performed by writing test data having a predetermined pattern in a semiconductor memory device, reading the data from the semiconductor memory device corresponding to the test data and comparing the read data and the test data.

The BIST operations according to the prior art require additional space to store the test data used for testing. Moreover since the BIST operations according to the prior art should be performed before a semiconductor memory device is installed in a system. Therefore, it was impossible to test a semiconductor memory device while the semiconductor memory device was in operation, and it was impossible to find errors or handle errors that occurred while the semiconductor memory device was being used in the system.

SUMMARY

Various embodiments are directed to a semiconductor device capable of testing a semiconductor memory device while the semiconductor memory device is in operation and an operating method thereof and more particularly to a semiconductor memory device capable of testing a semiconductor memory device by using data normally written or read to and from the semiconductor memory device and an operating method thereof.

In an embodiment, a semiconductor device may test a semiconductor memory device by storing a data sample that is sampled from among data requested to be written into a semiconductor memory device and by comparing the data sample with data read from the semiconductor memory device which corresponds to the data sample.

The semiconductor device may test the semiconductor memory device while the semiconductor memory device is in idle state.

In another embodiment, a semiconductor device may comprise a first data storage for storing a data sample that is sampled from among data requested to be written into a semiconductor memory device, an address storage for storing an sampled address corresponding to the data sample and a comparator for comparing the data sample stored in the first data storage with data read from the sampled address of the semiconductor memory device.

In another embodiment, a system may comprise a semiconductor memory device; and a memory controller for controlling the semiconductor memory device, wherein the memory controller may test the semiconductor memory device by storing a data sample that is sampled from among data requested to be written into a semiconductor memory device and by comparing the data sample with data read from the semiconductor memory device which corresponds to the data sample.

In the system, the memory controller may comprise a first data storage for storing the data sample; an address storage for storing a sampled address corresponding to the data sample; and a comparator for comparing the data sample with data read from sampled address of the semiconductor memory device.

In another embodiment, an operating method of a semiconductor device may comprise storing a data sample by sampling data from among data requested to be written into a semiconductor memory device; storing a sampled address corresponding to the data sample; reading data from the sampled address of the semiconductor memory device; and comparing the data sample with the data read from the sampled address of the semiconductor memory device.

In another embodiment, a storage medium may store steps executed by a processor wherein the steps may comprise storing a data sample by sampling data from among data requested to be written into a semiconductor memory device; storing a sampled address corresponding to the data sample; reading data from the sampled address of the semiconductor memory device; and comparing the data sample with the data read from the sampled address of the semiconductor memory device.

DETAILED DESCRIPTION

Figure 1:
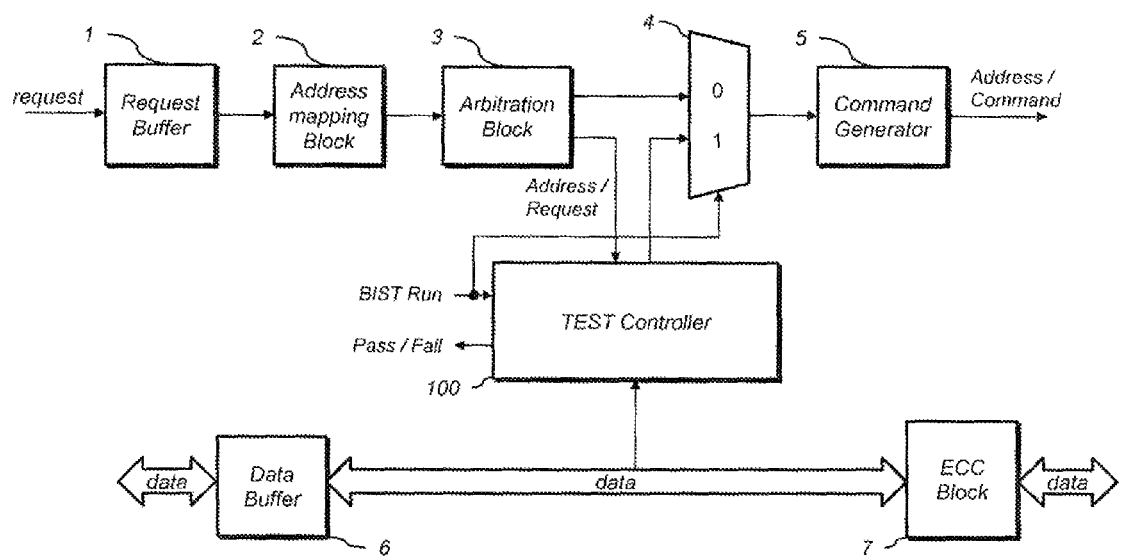
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey a scope of the present invention to those skilled in the art. Throughout the disclosure, like reference numerals refer to like parts throughout the various figures and embodiments of the present invention.

FIG. 1 is a block diagram illustrating a semiconductor device in accordance with an embodiment of the present invention.

The semiconductor device in accordance with embodiments of the present invention may be embodied as a memory controller for controlling a semiconductor memory device or a processor including the memory controller. Therefore the memory controller of the disclosure may designate a memory controller itself or a processor including the memory controller therein.

The semiconductor device in FIG. 1 may include a request buffer 1, an address mapping block 2 which maps a logical address from a host to a physical address of the semiconductor memory device, an arbitration block 3 which determines a processing order among requests to the semiconductor memory device from the host, a command generator 5 for generating a command for controlling the semiconductor memory device, and a data buffer 6 for temporarily storing data to and from the host and an ECC block 7. The ECC block may detect and/or correct errors in data read from the semiconductor memory device. The functions and structures of the request buffer 1, the address mapping block 2, the arbitration block 3, the command generator 5, the data buffer 6, and the ECC block 7 are well known.

A test controller 100 in accordance with an embodiment of the present invention may sample data from among data requested to be written into a semiconductor memory device. The test controller 100 may store the data sample and may compare the data sample with data read from the semiconductor memory device to test the semiconductor memory device.

The test controller 100 may begin to test the semiconductor memory device when the test controller 100 receives a test signal BIST Run. Further, the test controller 100 may provide a test result using a Pass/Fail signal. The test controller 100 may use address and request information from the arbitration block 3 and data from the data buffer 6 received via a data bus to sample data for the test.

The memory controller in accordance with an embodiment of the present invention may further include a selection block 4 to select a request from either the arbitration block 3 or the test controller 100 depending on whether a test operation is being performed, and to provide the selected request to the command generator 5. The command generator 5 may generate a command corresponding to the request selected at the selection block.

The test controller 100 may provide a read request to the command generator 5 to read data from the semiconductor memory device to be compared with a data sample. The selection block 4 may select a request from the test controller 100 instead of a request from the arbitration block 3 during a test operation.

The test signal BIST Run may be provided from the host in an embodiment. The test operation may be performed while the semiconductor memory device is in an idle state, performing the test operation while the semiconductor device is an idle state may prevent any loss in performance of the semiconductor device.

Figure 2:
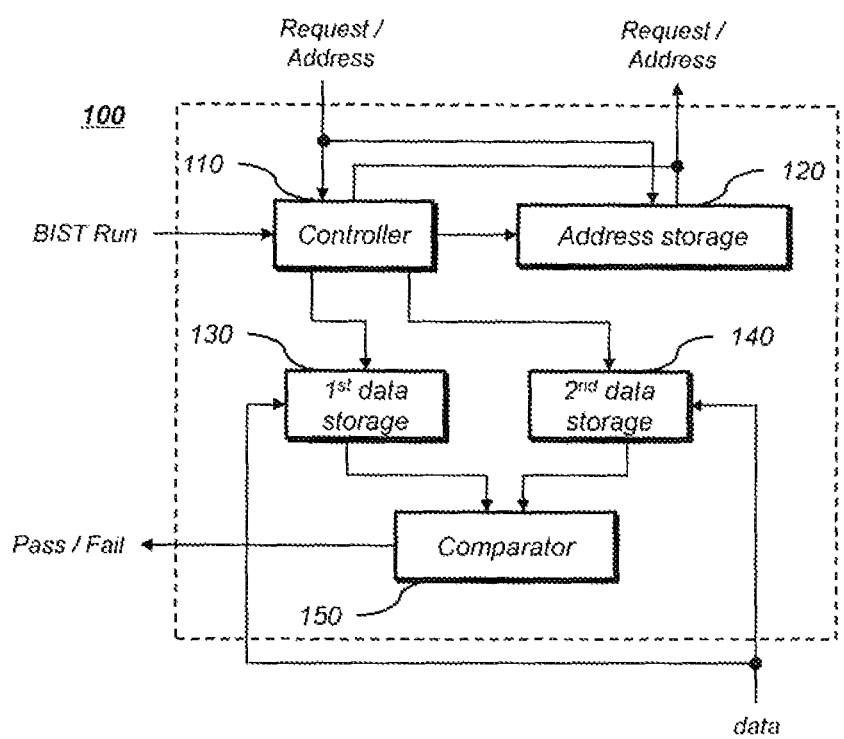
FIG. 2 is a block diagram illustrating a test controller shown in FIG. 1.

FIG. 2 is a block diagram illustrating a test controller 100 in accordance with an embodiment of the present invention.

The test controller 100 may comprise a controller 110, an address storage 120, a first data storage 130, a second data storage 140, and a comparator 150.

The controller 110 may sample data from data requested to be written to the semiconductor memory device from the host, and controller 110 may store the data sample in the first data storage 130. For example, the controller 110 may determine a request from the arbitration block 3 is a write request. In one embodiment, the controller 110 may sample data every predetermined number of write requests. When taking a data sample the controller 110 may control the first data storage 130 to store the data sample.

The controller 110 may control the address storage 120 to store an address corresponding to an address in the semiconductor memory device where data sample is to be written. This address may be referred to as a sampled address.

The controller 110 may begin a test operation when the test signal BIST Run is enabled. The test signal BIST Run may be enabled while the semiconductor memory device is in idle state.

The controller 110 may retrieve data read from the semiconductor memory device. The retrieved data may be compared with a data sample that was previously stored in the first data storage 130. To retrieve the data sample, the controller 110 may generate a read request and may provide the read request to the command generator 5 via the selection block 4. The read request may be provided along with a corresponding sampled address stored in the address storage 120. In one embodiment, the controller 110 may generate the read request to read data from the sampled address of the semiconductor memory device during a test operation.

When the controller 110 reads data corresponding to the address from the semiconductor memory device, the controller 110 may control the second data storage 140 to store the data read from the semiconductor memory device.

The controller 110 may compress or encode data before storing the data in the first data storage 130 and/or in the second data storage 140. Any specific compressing or encoding techniques may be used in the embodiment.

The comparator 150 may compare data stored in the first data storage 130 and a data stored in the second data storage 140 and may output a test result Pass/Fail according to the comparison.

The data stored in the first data storage 130 may be a data sample, and the data stored in the second data storage 140 may be data read from the semiconductor memory device, which corresponds to the data sample.

Therefore, if the data read from the semiconductor memory device does not match (is not equal to) the data sample, an error may have occurred in the semiconductor memory device when storing the data, associated with the data sample, into the semiconductor memory device. The semiconductor memory device may have corrupted the data.

Figure 3:
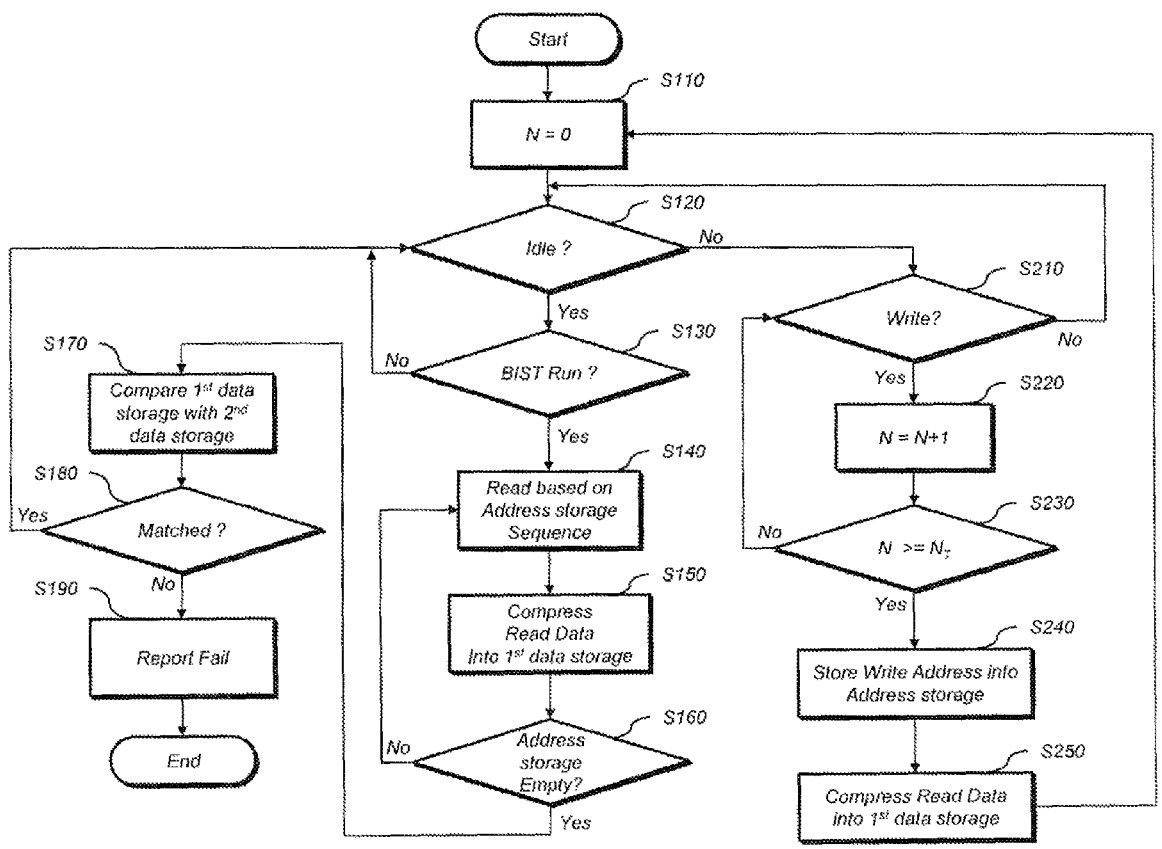
FIG. 3 is a flow chart illustrating an operation of the semiconductor device in accordance with an embodiment of the present invention.

FIG. 3 is a flow chart illustrating an operating method of the semiconductor device according to an embodiment of the present invention.

The steps S210~S250 may correspond to a sampling operation of the test controller 100 and the steps S130~S190 may correspond to a comparison operation of the test controller 100. The sampling operation may be performed while the semiconductor memory device is in normal operation and the comparison operation may be performed while the semiconductor memory device in an idle state.

The controller 110 may initialize an index N as 0 at step S110.

The controller 110 may check whether the semiconductor memory device is in an idle state at step S120.

If the semiconductor memory device is not in the idle state, the controller 110 may check if a write request was passed from the host at step S210. If a write request is not passed, the process may move back to step S120. If a write request is passed, the index N may be increased by 1 at step S220. The index N may be compared with a threshold value $N_T$ at step S230.

If the index N is smaller than the threshold value $N_T$, the process may go back to the step S210. If the index N is as large as or larger than the threshold value $N_T$, the controller 110 may store the requested address as the sampled address in the address storage 120 at step S240 and the controller 110 may store the requested data as sampled data in the first data storage 130 at step S250. The data stored in the first data storage 130 at S250 may be compressed, encoded or, compressed and encoded. The process may return to S110.

With the aforementioned processes the controller 110 may retrieve a data sample and corresponding sampled address every $N_T$ write requests. The controller 110 may store the sampled address in the address storage 120, and the controller 110 may store the data sample in the first data storage 130.

The comparison operation is now discussed. If, at S120, it is determined that the semiconductor memory device is in an idle state, the controller 110 may check whether a test signal BIST Run is enabled at step S130.

If the test signal BIST Run is not enabled, the process may go back to the step S120. If the test signal BIST Run is enabled, the controller 110 may read data from the semiconductor memory device corresponding to the sampled addresses stored in the address storage 120. The controller 110 may store the data read from the semiconductor memory device in the second data storage 140 at step S150. The data stored in the second data storage 140 may be compressed, encoded, or compressed and encoded. The sample addresses used in the step S150 may be removed from the address storage 120.

The controller 110 may check whether the address storage 120 is empty at step S160. If the address storage 120 is not empty, the steps S140 and S150 may be repeated until the address storage 120 becomes empty.

If the address storage 120 is empty the process may go to the next step S170. The second data storage 140 may comprise data read from the semiconductor memory device based on the sampled addresses. The first data storage 130, on the other hand, may include data samples associated with the sampled address.

The comparator 150 may compare the data from the first data storage 130 and the data from the second data storage 140 at step S170, and the comparator 150 may determine whether the data samples and the data read from the semiconductor memory device are equal to each other in the step S180. The S170 and S140 may be performed while the semiconductor memory device in in an idle state.

If the data samples and the associated data in the semiconductor memory device are equal, the process may go back to the step S120 because there is no failure. If the data are not equal, the controller may report the failure at step S190.

If the test controller 100 reports a failure, the memory controller or the host may use the failure signal to handle the failure in a predetermined manner. For example the host may report the address where the failure to the operating system so that the address is no longer used.

In an embodiment the test controller may be embodied with a as a nonvolatile memory device, such as ROM or Flash Memory Device, which may store a series of instructions which execute the operations disclosed with FIG. 3 and a processor to execute the instructions in the nonvolatile memory device. In one embodiment, the semiconductor device may include a medium for storing steps executed by a processor, the steps comprising Although various embodiments have been described for illustrative purposes, it will be apparent to those skilled in the art that various changes and modifications may be made without departing from the spirit and scope of the invention as defined in the following claims.

What is claimed is:

1. A semiconductor device for testing a semiconductor memory device by storing a data sample that is sampled from among data requested to be written into the semiconductor memory device, and by comparing the data sample with data read from the semiconductor memory device which corresponds to the data sample.

2. A semiconductor device comprising:
   a first data storage for storing a data sample that is sampled among data requested to be written into a semiconductor memory device;
   an address storage for storing a sampled address corresponding to the data sample; and
   a comparator for comparing the data sample stored in the first data storage with data read from the sampled address of the semiconductor memory device.

3. The semiconductor device of claim 2, further comprising a second data storage to store data read from the sampled address of the semiconductor memory device.

4. The semiconductor device of claim 3, wherein the data stored in the first data storage and in the second data storage are compressed, encoded, or compressed and encoded.

5. The semiconductor device of claim 2, further comprising a controller for controlling the first data storage to store the data sample.

6. The semiconductor device of claim 5, wherein the controller generates a read request to read data from the sampled address of the semiconductor memory device during a test operation.

7. The semiconductor device of claim 6, further comprising:
   an arbitration block for determining a processing order of requests to the semiconductor memory device;
   a selection block to select a request from the arbitration block or from the controller depending on whether a test operation is being performed; and
   a command generator for generating a command corresponding to the request selected at the selection block.

8. The semiconductor device of claim 7, wherein the sampled address stored in the address storage is provided to the command generator during the test operation.

9. A system comprising:
   a semiconductor memory device; and
   a memory controller for controlling the semiconductor memory device, wherein the memory controller tests the semiconductor memory device by storing a data sample that is sampled from among data requested to be written into a semiconductor memory device and by comparing the data sample with data read from the semiconductor memory device which corresponds to the data sample.

10. The system of claim 9, wherein the memory controller comprises:
    a first data storage for storing sampled data among data requested to be written into the semiconductor memory device;
    an address storage for storing a sampled address corresponding to the sampled data; and
    a comparator for comparing the sampled data stored in the first data storage with data read from the sampled address of the semiconductor memory device.

11. The system of claim 10, wherein the memory controller further comprises a controller for controlling the first data storage to store the sampled data.

12. The system of claim 11, wherein the controller generates a read request to read data from the sampled address of the semiconductor memory device during a test operation.

13. The system of claim 10, wherein the memory controller further comprises a second data storage to store data read from the sampled address of the semiconductor memory device.

14. The system of claim 13, wherein the data stored in the first data storage and in the second data storage are compressed, encoded, or compressed and encoded.

15. The system of claim 14, wherein the memory controller further comprises:
    an arbitration block for determining a processing order of requests to the semiconductor memory device;
    a selection block to select a request from the arbitration block or from the controller depending on whether a test operation is being performed; and a command generator for generating a command corresponding to the request selected at the selection block.

16. The system of claim 15, wherein the sampled address stored in the address storage is provided to the command generator during the test operation.

17. An operating method of a semiconductor device comprising:
   storing a data sample that is sampled from among data requested to be written into a semiconductor memory device;
   storing a sampled address corresponding to the data sample;
   reading data from the sampled address of the semiconductor memory device; and
   comparing the data sample with the data read from the sampled address of the semiconductor memory device.

18. The operating method of claim 17, the reading and the comparing are performed while the semiconductor memory device is in idle state.

19. The operating method of claim 17 further comprising:
   compressing, encoding, or compressing and encoding the sampled data; and
   compressing, encoding, or compressing and encoding the data read from the semiconductor memory device.

20. A medium storing steps executed by a processor, the steps comprising:
   storing a data sample that is sampled from among data requested to be written into a semiconductor memory device;
   storing a sampled address corresponding to the data sample;
   reading data from the sampled address of the semiconductor memory device; and
   comparing the data sample with the data read from the sampled address of the semiconductor memory device.

* * * * *